United States Patent [19]

Bullock

[11] 4,193,124
[45] Mar. 11, 1980

[54] SWAP AND REPLICATE GATES FOR MAGNETIC BUBBLE MEMORY

[75] Inventor: David C. Bullock, Dallas, Tex.

[73] Assignee: Texas Instruments Incorporated, Dallas, Tex.

[21] Appl. No.: 888,124

[22] Filed: Mar. 20, 1978

[51] Int. Cl.² ............................................. G11C 19/08
[52] U.S. Cl. ........................................ 365/12; 365/33; 365/43
[58] Field of Search ............................. 365/12, 15, 16

[56] References Cited
U.S. PATENT DOCUMENTS

| | | | |
|---|---|---|---|
| 4,012,726 | 3/1977 | Bonyhard et al. | 365/12 |
| 4,014,009 | 3/1977 | Bonyhard et al. | 365/12 |
| 4,020,476 | 4/1977 | Bonyhard et al. | 365/12 |

Primary Examiner—James W. Moffitt
Attorney, Agent, or Firm—William E. Hiller; Melvin Sharp; Richard L. Donaldson

[57] ABSTRACT

Input swap transfer/replicate gate and output replicate gate for use in a magnetic bubble memory arrangement between the bubble storage loops and the input and output sections respectively on opposite sides thereof. The input swap transfer/replicate gate and the output replicate gate are of double level construction, each type of gate including a hairpin element at the first level and mounted on a planar layer of bubble-supporting magnetic material on which bubble propagation elements of magnetically soft material are disposed. The bubble propagation elements are arranged to form propagation paths defining a bubble input section, a bubble output section, and a plurality of closed storage loops defining a bubble storage section interposed between the input and output bubble sections. The second levels of the swap transfer/replicate gate and output replicate gate are situated at the input and output ends of the storage loops, forming the opposite bights of the loop. Each type of gate at the second level comprises an asymmetric hook-like transfer/replicate element whose opposite ends are respectively disposed in the opposite courses of the storage loop of which it forms a bight. The hook-like element includes an intermediate leg portion thereof disposed in overlapping relation to the loop region of the hairpin element, the intermediate leg portion being of wedge-shaped configuration and tapering toward the leading end of the asymmetric hook-like transfer element so as to have a reduced width dimension at the leading end thereof. The wedge-shaped configuration of the intermediate leg of the asymmetric hook-like element is responsible for greater reliability in data transfer and replication as represented by bubbles and the absence of bubbles into and out of the storage loops of the magnetic bubble memory organization.

9 Claims, 7 Drawing Figures

SWAP AND REPLICATE GATES FOR MAGNETIC BUBBLE MEMORY

This invention relates to magnetic bubble memory structures, and more particularly to magnetic bubble arrangements providing a double level swap transfer/replicate gate and a double level replicate output gate respectively located at the input and output ends of a corresponding minor propagation path loop included in an intermediate bubble storage section disposed between major bubble propagation paths comprising bubble input and output sections. The particular forms of double level swap transfer/replicate gate structure and replicate output gate structure described herein constitute improvements of the subject matter disclosed and claimed in pending U.S. application, Ser. No. 783,996 filed Apr. 4, 1977 entitled "Magnetic Bubble Memory Circuit with Input Swap and Output Replicate Gates", now U.S. Pat. No. 4,152,776 issued May 1, 1979.

Typically, magnetic domain memories include one or more memory storage loops, accommodating a plurality of magnetic single-walled domains or bubbles, each of which represents one bit of binary information. These bubbles may be rotated about individual memory storage loops in a synchronized and controlled manner such that access to the stored information imparted thereby can be gained. The memory storage loops are usually organized as a plurality of minor storage loops associated with a major storage loop, wherein information in the form of a series of magnetic bubbles and voids respectively representing binary "1's" and "0's" may be transferred between the major loop and each of the respective minor loops so as to enable information to be read from the memory and to be written into the memory as desired. The magnetic bubble memory chip comprises a substrate of non-magnetic material on which a planar film or layer of magnetic material capable of supporting magnetic bubbles is disposed. The magnetic bubbles are caused to travel along predetermined paths within the layer of bubble-supporting magnetic material by laying down a magnetizable bubble propagation path pattern on the layer of magnetic material as a series of thin film propagation elements of magnetically soft material, e.g. permalloy, in the form of tiny geometric shapes or circuit elements. In this respect, a magnetic drive field within the plane of the layer of magnetic material is rotated which causes the individual propagation elements included in the bubble propagation path pattern to be sequentially polarized in a cyclical sequence causing the individual bubbles to be propagated in a step-wise movement along the path as defined by the magnetizable propagation elements. One such overlay pattern commonly employed in a magnetic bubble memory chip is the so-called series of alternating T-shaped and bar-shaped permalloy elements. A chevron pattern of permalloy elements is another common configuration for this purpose. More recently, an asymmetric form of the chevron pattern has come into vogue as a bubble propagation path element. Magnetic bubble memories and some general types of bubble propagation paths employed therewith in the processing of data as represented by the presence and absence of magnetic bubbles as hereinbefore described are disclosed in the article "Magnetic Bubbles" by Andrew H. Bobeck and H. E. D. Scovil, in *Scientific American* magazine, pages 78–90 (June 1971).

While these bubble propagation path patterns on a magnetic bubble memory chip have generally provided satisfactory operation, the small size of the magnetizable circuit elements as employed in the bubble propagation path pattern overlay as used for magnetic bubbles of five micron size or smaller and the precision with which these soft magnetic elements must be applied to the bubble-supporting magnetic layer present difficulties in maintaining the limited alignment tolerances required to produce a bubble propagation path pattern complete with bubble function-determining components, such as bubble generators, replicators, annihilators and transfer gates, for example, which operates in a fully reliable manner in propagating bubbles in guided paths about the bubble-supporting magnetic layer of the memory chip. In this connection, the movement of each of the bubbles on the memory chip as to direction and the action thereon by various bubble function-determining components must be precise and wholly predictable if the memory chip is to perform in a manner enabling data retrieval as represented by the presence or absence of magnetic bubbles when read from the memory chip output by suitable magnetic bubble detectors. Additionally, it is desirable to so construct the memory chip to enable nondestructive readout of data, thereby requiring a replicate function on the chip to replicate respective bubbles as these bubbles are being directed onto a readout path for subsequent sensing by a bubble detector and erasure by an annihilator. The replicate bubble is returned to the same virtual position in a bubble propagation path from which the bubble to be subsequently detected had departed to preserve the data intact on the memory chip. To this end, magnetic bubble memory chips commonly include a bubble replicate function therewith in the form of a particular bubble replicate member disposed in the bubble propagation path pattern at an appropriate location and operable to effectively split a bubble to be subsequently read out, thereby producing two bubbles with the second replicate bubble being returned to the same virtual position departed by the bubble to be readout. Bubble replicator structures heretofore known, in a like manner to the individual propagation elements of magnetically soft material included in the bubble propagation path pattern, have been subject to extremely narrow tolerance ranges in relation to control conductors to which the bubble replicators are responsive in order to properly perform the replicate function in duplicating a bubble to be read out by a bubble detector on the chip.

A purported swap transfer gate structure and a replicate/transfer output gate structure are disclosed in an article entitled "68 kBit Capacity 16 $\mu$m-Period Magnetic Bubble Memory Chip Design With 2 $\mu$m Minimum Features" by P. I. Bonyhard and J. L. Smith appearing in *IEEE Transactions on Magnetics,* Vol. MAG-17, No. 6, pp. 614–617 (Nov. 1976). However, the so-called swap transfer gate disclosed in the aforesaid article is not a true swap transfer gate because the virtual positions of data bits being swapped between a major propagation path and a minor storage loop are not maintained. Thus, the structure is more properly termed a pseudo-swap transfer gate. The replicate/transfer output gate of the Bonyhard et al article is subject to a similar limitation in data processing which restricts its usefulness.

In the aforesaid pending U.S. application, Ser. No. 783,996 filed Apr. 4, 1977, now U.S. Pat. No. 4,152,776, a magnetic bubble domain structure is provided in which swap transfer gates are interposed between the bubble input section and each of the respective storage loops included in even and odd blocks of storage loops comprising the bubble storage section. The swap transfer gates are so configured as to be responsive to a pulsed energy signal from a pulse generator as regulated by an appropriate control circuit for introducing data as represented by chains of magnetic bubbles and voids from the bubble input section to the storage loops included in the even and odd blocks, while simultaneously accomplishing a reverse transfer of data from the respective storage loops of the even and odd blocks comprising the bubble storage section to the bubble input section. Throughout the simultaneous data transfer, the virtual positions of the data bits being swapped are maintained, thereby resulting in a true swap operation as contrasted to the pseudo-swap achievable by the structure disclosed in the previously discussed Bonyhard et al article. In addition, replicate gates are disposed between each of the bubble storage loops included in the even and odd blocks comprising the bubble storage section and the bubble output section to enable retention of data within the storage loops while accomplishing data readout in that the replicate gates are effective to split respective magnetic bubbles in response to an appropriate pulsed energy signal imparted thereto by the pulse generator. Thus, the replicate gates upon the splitting of a respective magnetic bubble to form a replicate magnetic bubble in addition to the original magnetic bubble provide for transfer of one of the two bubbles from the storage loop included in the bubble storage section to the bubble output section while retaining the other of the two bubbles in the storage loop. The replicate gate, like the swap transfer gates, maintain intact the virtual positions of the data bits directed thereto.

The swap transfer gate and replicate gate as disclosed in the aforesaid pending U.S. application, Ser. No. 783,996 filed Apr. 4, 1977, now U.S. Pat. No. 4,152,776 are each characterized by a 90° hook-like element provided at the second level of the double level construction thereof, the 90° hook-like element being correlated into bubble propagation elements included in a storage loop. The respective 90° hook-like elements of corresponding swap transfer and replicate gates are positioned at the input and output ends of the storage loops and form the opposite bights of each loop. This particular configuration, although generally satisfactory with respect to reliability of data transfer via movement of bubbles and voids to and from the storage loops with respect to the input and output bubble sections of the magnetic bubble memory arrangement, does occasionally encounter problems. The pole strengths of the bubble positions to be assumed in traversing the 90° hook-like element are of fairly diverse variable magnitudes tending to increase the strength of the required drive field and contributing to a greater incidence of bubble-to-bubble interaction which adversely affects the operation of the swap transfer gate and the replicate gate as so configured.

SUMMARY OF THE INVENTION

This invention is directed to an input swap transfer/replicate gate and an output replicate gate of modified configuration as compared to the swap transfer gate and replicate gate disclosed in pending U.S. application Ser. No. 783,996 filed Apr. 4, 1977, now U.S. Pat. No. 4,152,776 which offer improved reliability in transferring data as represented by bubbles and voids into and out of the storage loops with which the gates are associated. The input swap transfer/replicate gate structure and the output replicate gate structure are employed in conjunction with a magnetic bubble memory of the general character including a bubble storage section comprising a plurality of minor propagation paths in the form of storage loops and cooperating with input and output bubble sections as defined by major bubble propagation paths. The particular swap transfer/replicate gate and replicate gate structures are of double level construction, wherein the magnetic bubble memory itself comprises a multi-level assembly including a nonmagnetic substrate, a planar layer of bubble-supporting magnetic material disposed thereon, and a multi-level assembly including patterned first and second metallization levels separated by an intermediate insulation layer disposed on the planar layer of magnetic material. The first metallization level includes the control conductors for the bubble function-determining components and the propagation elements which constitute the permalloy overlay pattern forming the second metallization level. The control conductor for each of the swap transfer/replicate gate and the replicate gate structures comprises an elongated hairpin element having a loop region defined at one end thereof and being of modified configuration as compared to the hairpin element disclosed in pending U.S. application Ser. No. 783,996 filed Apr. 4, 1977, now U.S. Pat. No. 4,152,776. This hairpin element is included in the first metallization level of control conductors and is mounted directly onto the planar layer of bubble-supporting magnetic material. The insulation layer is disposed atop the hairpin element included in each of swap transfer/replicate gate and replicate gate structures.

The second level of the swap transfer/replicate gate and replicate gate structures is disposed at the same level as the permalloy elements defining the bubble propagation paths and comprises an asymmetric hook-like transfer/replicate element disposed at each respective end of a corresponding storage loop so as to form the opposite bights of the loop. The asymmetric hook-like element has an asymmetric chevron-shaped portion which forms an extension of one course of the closed loop path and a wedge-shaped bight portion integral with the asymmetric chevron-shaped portion and extending across the courses of the closed loop path to form the turn or bight of the loop. The wedge-shaped bight portion tapers from the asymmetric chevron-shaped portion and terminates in an end portion remote from the asymmetric chevron-shaped portion and disposed in the other course of the closed loop path. The wedge-shaped bight portion of the asymmetric hook-like element is generally aligned with the loop region of the underlying hairpin element so as to extend across the loop region in spaced insulated overlapping relation thereto. Operation of a pulse generator in a selected control mode to develop a pulse energy signal of a predetermined width directed to the hairpin element of a swap transfer/replicate gate structure enables data as represented by chains of magnetic bubbles and voids to be simultaneously interchanged between the bubble input section and the storage loop included in the bubble storage section. Thus, new data may be introduced into the bubble storage section during a write mode while simultaneously withdrawing old data from the bubble storage section, thereby materially reducing the time required for the substitution of new data into the bubble storage section of the magnetic bubble memory chip.

Similarly, the output replicate gate structure, upon an appropriate signal being imparted to the hairpin control conductor therefor by the pulse generator, may be operated in a replicate mode so as to split a respective magnetic bubble to form a replicate magnetic bubble in addition to the original magnetic bubble. This enables one of the bubbles to be transferred from the storage loop included in the bubble storage section to the bubble output section for detection during a read mode, while retaining the other of the two bubbles in the same virtual bit position in the storage loop, thereby accomplishing non-destructive data readout.

Generally, the swap transfer/replicate gate and replicate gate structures contemplated by the present invention permit greater flexibility in data processing with a magnetic bubble memory in which the structures are included, while providing for enhanced reliability of operation in comparison to the swap transfer gate and replicate gate structures disclosed in pending U.S. application, Ser. No. 783,996 filed Apr. 4, 1977, now U.S. Pat. No. 4,152,776.

Figure 1:
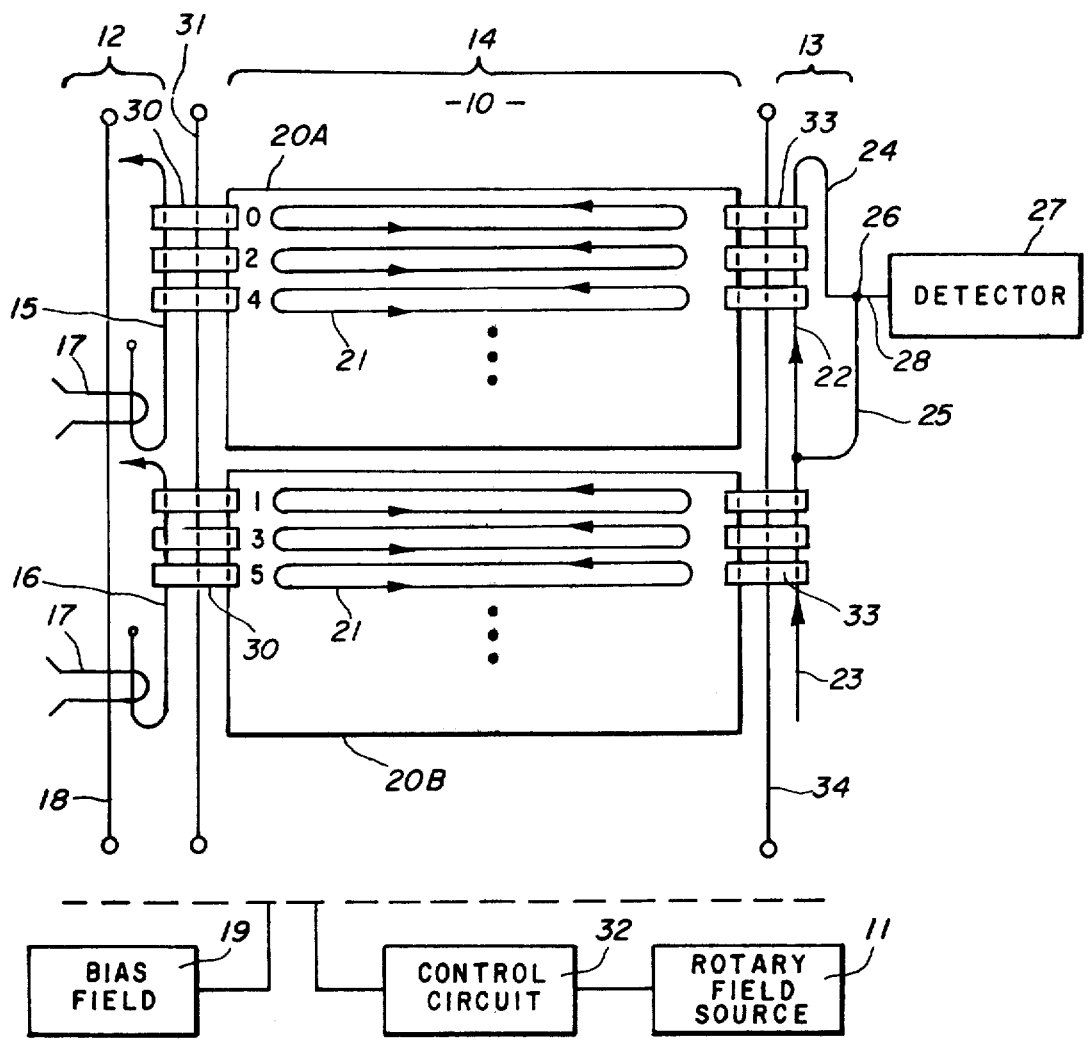
FIG. 1 is a diagrammatic view of a typical magnetic bubble memory chip arrangement which may employ input swap transfer/replicate gates and output replicate gates in accordance with the present invention.

Referring more specifically to the drawings, FIG. 1 schematically illustrates a typical magnetic bubble memory chip arrangement such as disclosed in pending U.S. application, Ser. No. 783,996 filed Apr. 4, 1977, now U.S. Pat. No. 4,152,776, in which the particular input swap transfer/replicate gate and output replicate gate structures as constructed in accordance with the present invention may be incorporated. It will be understood that the magnetic bubble memory chip of FIG. 1 comprises a non-magnetic substrate portion having a planar bubble-supporting magnetic film or layer possessing a uniaxial anisotropy, the bubble-supporting planar magnetic layer being generally designated at 10. Commonly, the non-magnetic substrate is a non-magnetic rare earth garnet, gadolinium gallium garnet (GGG) for example, and the film or layer 10 is an epitaxially deposited garnet layer, e.g. $(YSmCaLu)_3 (FeGe)_5 O_{12}$ of the order of about 2 microns in thickness for use with magnetic bubbles of 2 microns in diameter and having an easy magnetization in a direction perpendicular to the plane of the layer. Other materials suitable as the epitaxially grown layer of bubble-supporting magnetic material and which may have a thickness range of the order of 1–10 microns include: $(YSm)_3 (FeGa)_5 O_{12}$, $(YGdTm)_3 (FeGa)_5 O_{12}$, $(YEuYb)_3 (FeAl)_5 O_{12}$, $(YGdYb)_3 (FeGa)_5 O_{12}$, $(YEu)_3 Fe_5 O_{12}$, $(LuSm)_3 Fe_5 O_{12}$, $(YGd)_3 Fe_5 O_{12}$ and $(YSmCa)_3 (FeGe)_5 O_{12}$.

In FIG. 1, a bubble propagation path pattern is disposed on the layer of magnetic material 10 for guiding the movement of the bubbles in the layer 10 in response to a change in orientation of a rotary magnetic field within the plane of the layer 10, the rotary in-plane magnetic field being provided from a rotary field source 11. The bubble propagation path pattern may comprise an overlay pattern of magnetically soft material, e.g. permalloy, disposed on a major surface of the planar magnetic layer 10. In the latter connection, it will be understood that a multi-level assembly is formed on the planar magnetic layer 10 including patterned first and second metallization layers and a layer of insulating material, such as silicon dioxide, interposed therebetween. The first metallization layer is patterned to define control conductors and component parts of bubble function-affecting structures as hereinafter described. The patterned second metallization layer comprises the overlay pattern of magnetically soft material. As shown in FIG. 1, this overlay pattern of magnetically soft material may be generally arranged to include a bubble input section 12, a bubble output section 13, and an intermediate bubble storage section 14 disposed between the bubble input section 12 and the bubble output section 13. The bubble input section 12 and the bubble output section 13 comprise major bubble propagation paths, while the intermediate bubble storage section 14 comprises a plurality of minor bubble propagation paths in the form of individual closed bubble storage loops. The bubble input section 12 includes a pair of major propagation paths 15 and 16 arranged in a tandem configuration, with each major propagation path including a bubble generator 17 thereon. Each bubble generator 17 may be of a suitable form, such as a hairpin structure, to produce bubbles at each complete rotation of the in-plane magnetic drive field source 11 for respective propagation along the major propagation paths 15 and 16 included in the bubble input section 12. The major propagation path 15 is an "even" generator track, and the major propagation path 16 is an "odd" generator track. The generators 17, 17 are operated in series, with the even generator track 15 being constructed so as to have one extra propagation step as compared to the odd generator track 16. The generators 17, 17 are selectively actuated to produce bubbles by applying a pulsed energy signal of a predetermined width to a control conductor 18 operably associated with the generators 17, 17 and included in the first metallization layer. It will be understood that the individual magnetic bubble domains have a diameter as determined by a magnetic bias field supplied by a source 19 and applied substantially perpendicularly to the chip. Bubble diameters as small as 1-5 microns may be employed in the operation of the magnetic bubble memory chip of FIG. 1.

As shown, the bubble storage section 14 is arranged in a block replicate form so as to provide first and second blocks 20A and 20B, each of which is defined by a respective plurality of bubble storage loops 21. The first block 20A of the bubble storage section 14 is an "even" block containing minor storage loops 21 numbered 0, 2, 4 . . . , and the second block 20B comprises an "odd" block containing minor storage loops 21 numbered 1, 3, 5, . . . .

The bubble output section 13 includes first and second major propagation paths 22 and 23 arranged in end-to-end relationship, wherein the major propagation path 22 comprises an "even" detector track and the major propagation path 23 comprises an "odd" detector track. The bubble output section 13 further includes respective extensions of the major propagation paths 22 and 23, there being a major propagation path extension 24 associated with the even detector track 22 and a major propagation path extension 25 associated with the odd detector track 23. The combined even detector track 22, 24 of the bubble output section 13 is constructed so as to have one less propagation step as compared to the combined odd detector track 23, 25. In this respect, the extension 24 of the major propagation path 22 doubles back on a portion thereof to intersect with the extension 25 of the major propagation path 23, the extension 25 continuing from the major propagation path 23 in an offset leg and then parallel to a portion of the major propagation path 22. The intersection of the extensions 24, 25 of the even and odd detector tracks 22 and 23 comprises a merge junction point 26. The merge junction point 26 is connected to a suitable bubble detector 27 by a continuation of the major propagation path 28 extending from the merge junction point 26 to the detector 27. The continuation portion of the major propagation path or detector feed track 28 delivers data in the form of respective chains of magnetic bubbles and voids representing binary 1's and 0's at the field rate of data introduction into the magnetic bubble memory circuit chip for detection. It will be understood that the data bits delivered to the detector 27 via the detector feed track 28 alternate between even and odd bits respectively obtained from the even and odd blocks 20A and 20B.

A plurality of input swap transfer/replicate gates 30, corresponding in number to the storage loops 21 in the respective blocks 20A and 20B, are operably interconnected with the minor loops 21 and with the even and odd generator tracks 15 and 16 by virtue of a control line 31 leading to a pulse generator. It will be understood that upon properly pulsing the control line 31 via a control circuit 32 including a variable pulse generator, data interchange may be effected from the bubble input section 12 to the bubble storage section 14 and simultaneously from the bubble storage section 14 to the bubble input section 12. Thus, a bubble may be transferred from the bubble input section 12 to a particular storage loop 21 in the bubble storage section 14 via the swap transfer/replicate gate 30 corresponding thereto and vice versa, thereby enabling bubbles to travel simultaneously in either direction between the bubble input section 12 and each of the respective storage loops 21 included in the blocks 20A and 20B upon proper activation of the respective swap transfer/replicate gates 30 associated with each of the storage loops 21 in the bubble storage section 14. As previously noted, the pair of generators 17, 17 are operated in series such that when data is swapped from the major propagation paths 15 into the minor loops 21 of the even block 20A, and odd bits are transferred from the odd generator track 16 into the minor loops 21 of the odd block 20B. Any remaining bits on the even and odd generator tracks 15, 16 which are unaffected by the swap pulse are propagated to a guard rail associated with the even and odd generator tracks 15, 16 where such data is annihilated.

Similarly, a plurality of output replicate gates 33 are provided between each of the respective minor loops 21 included in the even and odd blocks 20A and 20B and the bubble output section 13, being arranged at the ends of the storage loops 21 opposite from the swap transfer/replicate gates 30. The plurality of output replicate gates 33 are operably interconnected by a control line 34 which is connected to the control circuit 32. The variable pulse generator included in the control circuit 32 upon producing a predetermined pulse of a different width as compared to the pulse required to activate the swap transfer/replicate gates 30 in a swap mode is effective to activate the respective output replicate gates 33.

Upon activation by a proper pulse from the pulse generator along the control line 34, the respective output replicate gates 33 perform a composite replicate/transfer function in which any bubble incident thereon from the particular storage loop corresponding thereto is replicated to provide a duplicate or replicate bubble for return to the storage loop in the same virtual position from which it was input to the replicate gate 33, while the bubble is transferred to the bubble output section 13 for propagation along the even or odd detector track 22 or 23 depending upon which of the even or odd blocks 20A or 20B contains the particular storage loop 21. The even and odd detector tracks 22 and 23 guide the respective bubbles transferred from the minor storage loops 21 included in the even and odd blocks 20A and 20B to the detector 27 via the merge junction point 26 and the detector feed track 28, wherein data arrives at the detector 27 for readout.

Employing the input swap transfer/replicate gates 30 and the output replicate gates 33 in conjunction with a magnetic bubble memory arrangement of the block replicate type affords a substantial improvement by reducing the average access time required for the first bit and by reducing the time required for reading the entire data content of the even and odd blocks 20A and 20B as contrasted to magnetic bubble memory arrangements of the typical major/minor loop type. However, it will be understood that the input swap transfer/replicate gates 30 and the output replicate gates 33 may be employed in a typical major/minor bubble propagation path architecture, where the minor bubble propagation paths are arranged in a unitary bubble storage section comprising a plurality of minor loops for interaction with major bubble propagation paths disposed on opposite sides thereof and comprising a bubble input section and a bubble output section respectively. It is further contemplated that the input swap transfer/replicate gate and output replicate gate structures herein disclosed could also be employed in a chip architecture where the major propagation path or paths as well as the minor propagation paths define respective closed loops.

Figure 2:
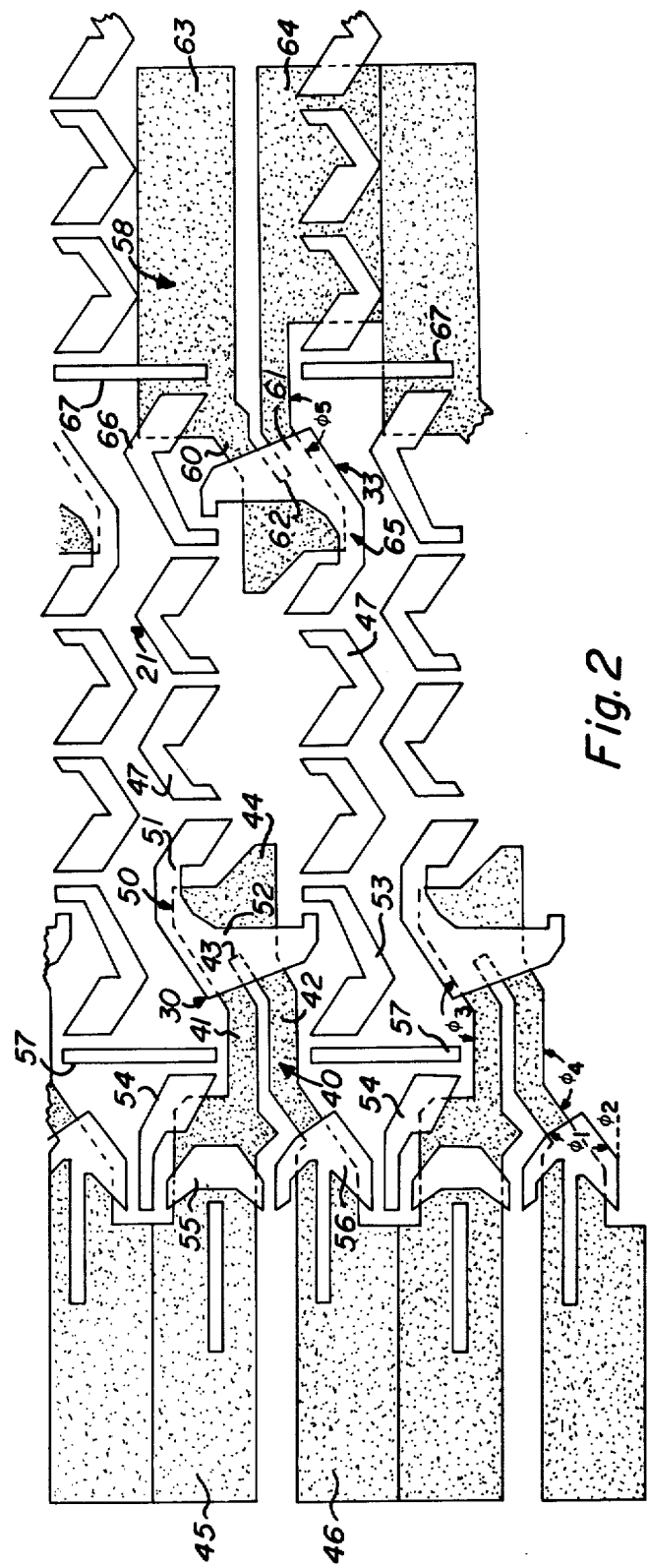
FIG. 2 is an enlarged, partially schematic, plan view of a portion of a magnetic bubble propagation path pattern employable in a magnetic bubble memory chip such as shown in FIG. 1, and illustrating an input swap transfer/replicate gate and an output replicate gate configured in accordance with the present invention as located at opposite ends of a data storage loop.

Referring now to FIG. 2, there is illustrated in enlarged schematic form an operable segment of the magnetic bubble memory chip arrangement shown in FIG. 1, wherein the particular input swap transfer/replicate gate 30 and the output replicate gate 33 as contemplated by the present invention are associated with the opposite ends of a storage loop 21 included in the bubble storage section 14. For purposes of illustration, the individual courses of the closed storage loop 21 have been drastically reduced so as to show only two bubble propagation elements of soft magnetizable material (e.g. permalloy) in each of the courses as associated with respective portions of the input swap transfer/replicate gate 30 and the output replicate gate 33. However, it will be understood that a substantial number of bubble propagation elements are provided in defining the respective courses of the closed storage loop 21. The input swap transfer/replicate gate 30 comprises a double level structure including a first metallization layer in the form of a substantially U-shaped hairpin element 40. The hairpin element 40 includes a pair of elongated legs 41,42 joined at one end to define a hairpin loop 43. The elongated legs 41,42 include respective intermediate parallel portions terminating in angularly offset end sections, wherein the respective sets of offset end sections are generally parallel to each other, being offset in opposite directions from the intermediate parallel portions of the elongated legs 41,42. One set of the angularly offset end sections defines the hairpin loop 43, this set of angularly offset end sections terminating in an end portion integral therewith and having a bevelled projection 44 extending outwardly from the hairpin loop 43. The other set of angularly offset end sections terminates in a pair of enlarged pads 45,46 at the opposite ends of the elongated legs 41,42. It will be understood that a patterned insulation layer (not shown) as previously described overlies the substantially U-shaped hairpin element 40 of the input swap transfer/replicate gate 30, and a second metallization layer is formed thereon to include the other elements of the swap transfer/replicate gate 30 at the second level thereof which is at the same level as the individual bubble propagation elements 47 defining the storage loop 21 in the bubble storage section 14. Although the individual bubble propagation elements 47 are shown as being of the asymmetric chevron type, it will be understood that any other suitable bubble propagation path elements may be employed, such as the typical path sequence of alternating T and bar elements, for example.

The input swap transfer/replicate gate 30 includes at the second level thereof an asymmetric hook-like transfer/replicate element 50 which is disposed at one end of the minor bubble propagation path comprising the storage loop 21 so as to form a bight of the loop. The asymmetric hook-like element 50 has an asymmetric chevron-shaped portion 51 which forms an extension of one course of the closed loop path and a wedge-shaped bight portion 52 integral with the asymmetric chevron-shaped portion 51 and extending across the courses of the closed loop path to form the turn or bight of the loop 21. The wedge-shaped bight portion 52 tapers from the asymmetric chevron-shaped portion 51 and terminates in an end portion remote from the asymmetric chevron-shaped portion 51 and disposed in the other course of the closed loop path. The wedge-shaped bight portion 52 of the asymmetric hook-like element 50 is generally aligned with the loop region 43 of the underlying hairpin conductor element 40 so as to extend across the loop region 43 in spaced insulated overlapping relation thereto.

The second level of the input swap transfer/replicate gate 30 further includes first and second spacer elements or bubble steering elements 53 and 54. The first spacer element 53 is in the form of an asymmetric chevron member associated with the storage loop 21 defined by the minor bubble propagation path. The asymmetric chevron spacer element 53 is arranged on one side of the hairpin element 40 so as to include one end portion thereof interposed between a corresponding end of the asymmetric hook-like transfer/replicate element 50 and a propagation element 47 of the storage loop 21. The opposite end of the asymmetric chevron spacer element 53 is disposed in proximity to the intermediate parallel portion of the elongate leg 42 of the hairpin element 40 at a location spaced from the hairpin loop region 43. A pair of second spacer elements 54,54 are provided in association with the major bubble propagation path which extends in orthogonal relationship to the storage loop 21 and transversely across the hairpin element 40. In this respect, one of the second spacer elements 54 is associated with the major propagation path on one side of the hairpin element 40, and the other of the second spacer elements 54 is associated with the major propagation path on the opposite side of the hairpin element 40. Each of the respective second spacer elements 54,54 includes one end portion thereof interposed between individual bubble propagation elements included in the major bubble propagation path. The major bubble propagation path in the region of the input swap transfer/replicate gates 30 is defined by an alternating sequence of bubble propagation elements including a symmetrical trapezoidal body provided with tapering legs at the opposite ends thereof as a bubble propagation element 55, and a transition bubble propagation element 56. The transition bubble propagation element 56 is generally in the shape of an arrow having an asymmetric tapered head located in slightly offset relation to an integral bar or tail which extends therefrom in a direction away from the loop 21. The bubble propagation element 55 and the transition bubble propagation element 56 respectively overlie the elongated legs 41,42 of one hairpin element 40 adjacent to the terminal pads 45,46. On the downstream side of the major propagation path in relation to the hairpin element 40, the end portion of one of the second spacer elements 54 is interposed between the latter bubble propagation element 55 and a transition bubble propagation element 56 associated with the next successive hairpin element 40. On the upstream side of the hairpin element 40, the end portion of the other second spacer element 54 is disposed between the transition bubble propagation element 56 and a bubble propagation element 55 associated with the preceding hairpin element 40.

A pair of pick-off bars 57,57 are included in the second level, being disposed on opposite sides of the hairpin element 40 so as to be located substantially perpendicular to the intermediate parallel portions of the elongated legs 41, 42 of the hairpin element 40. The pick-off bar 57 located on the upstream side of the hairpin element 40 with respect to the direction of bubble movement through the major propagation path is disposed between the first spacer element 53 and the second spacer element 54 associated therewith. In this connection, one end of the pick-off bar 57 lies adjacent to one end portion of the first spacer element 53, while the opposite end of the pick-off bar 57 lies adjacent to the end portion of the second spacer element 54 remote from that end portion interposed between individual bubble propagation elements included in the major bubble propagation path. The other pick-off bar 57 is located on the downstream side of the hairpin element 40 and has one end portion disposed adjacent to the end portion of the second spacer element 54 remote from the major bubble propagation path.

The output replicate gate 33 is located at the opposite end of the storage loop 21 from the input swap transfer/replicate gate 30. The output replicate gate 33 comprises a double level structure including a first metallization layer in the form of a substantially U-shaped hairpin element 58. The hairpin element includes a pair of substantially parallel angularly extending legs 60,61 joined at one end to define a hairpin loop 62. The opposite ends of the legs 60,61 with respect to the hairpin loop 62 terminate in enlarged pads 63,64. The patterned insulation layer (not shown) overlies the hairpin element 58 of the output replicate gate 33 and the second metallization layer as formed thereon includes the other elements of the replicate gate 33 at the second level thereof which is at the same level as the individual bubble propagation elements 47 defining the storage loop 21 in the bubble storage section 14.

The output replicate gate 33 includes at the second level thereof an asymmetric hook-like transfer/replicate element 65 which is disposed at the opposite end of the minor bubble propagation path comprising the storage loop 21 from the end at which the asymmetric hook-like transfer/replicate element 50 of the input swap transfer/replicate gate 30 is disposed. The asymmetric hook-like element 65 is of identical configuration to the asymmetric hook-like element 50 and forms the other bight of the storage loop 21. The asymmetric hook-like element 65 of the output replicate gate 33 is disposed in diametrically opposite relation as compared to the asymmetric hook-like element 50 of the input swap transfer/replicate gate 30, wherein the opposite ends of the hook-like element 65 are located in the opposite courses of the storage loop 21. The wedge-shaped bight portion of the hook-like element 65 is thereby located in overlapping relation to the hairpin loop region 62 of the hairpin element 58. The second level of the output replicate gate 33 further includes a spacer element or bubble steering element 66 and a pair of pick-off bars 67,67. The spacer element 66 is identical to the first spacer element 53 of the input swap transfer/replicate gate 30, being located in a diametrically opposite relation as compared thereto. The spacer element 66 is arranged so as to include one end portion thereof interposed between a corresponding end of the hook-like element 65 and a propagation element 47 of the storage loop 21. The opposite end portion of the spacer element 66 extends into overlapping relationship with the enlarged pad 63 of the underlying hairpin element 58, it being understood that the insulating layer between the first and second metallization layers is interposed therebetween. The pick-off bars 67,67 are generally disposed on opposite sides of the hairpin element 58.

Figure 3A:
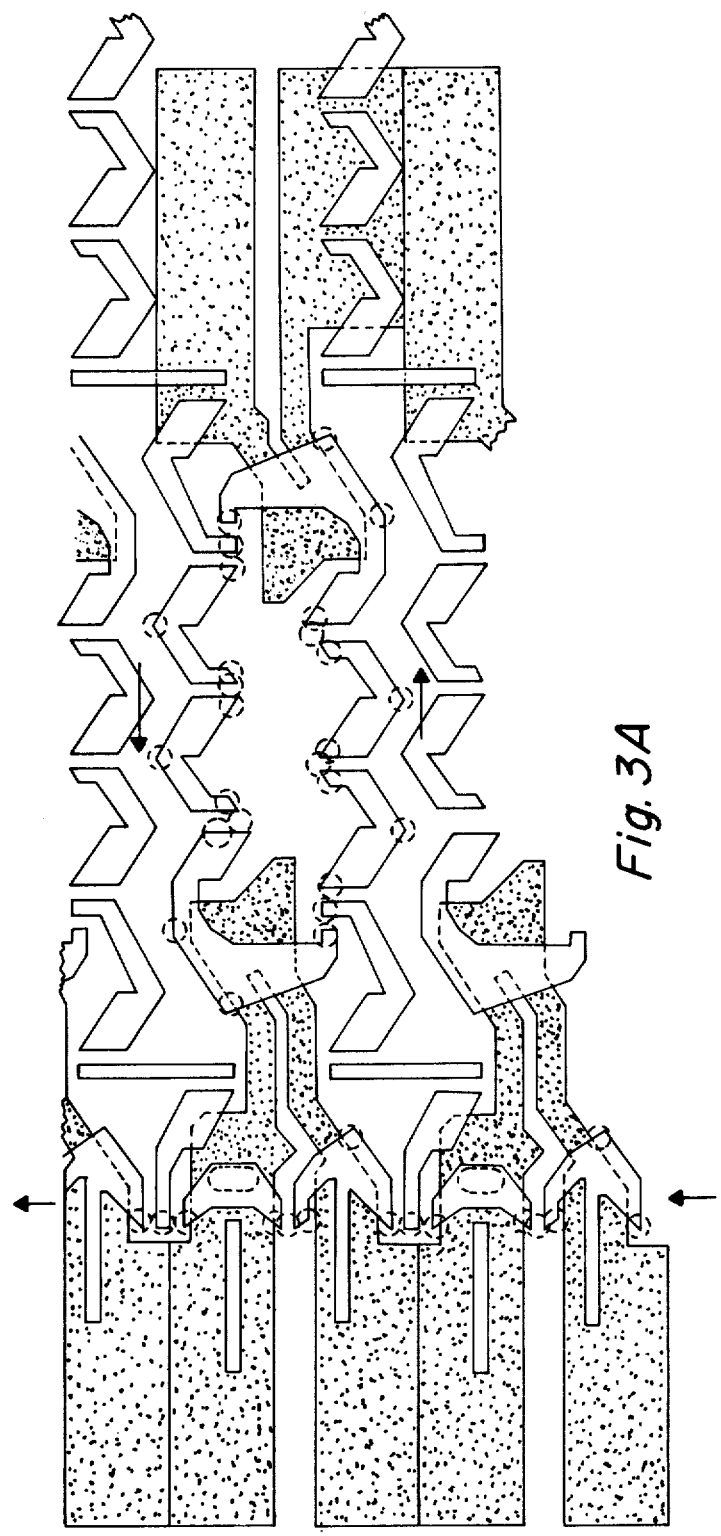
FIG. 3A is an enlarged, partially schematic, plan view similar to FIG. 2, showing the normal propagation movement of respective magnetic bubbles in relation to the swap transfer region when the input swap transfer/replicate gate is not actuated.

Referring to FIG. 3A, the same embodiments of the input swap transfer/replicate gate 30 and the output replicate gate 33 as shown in FIG. 2 are depicted therein. FIG. 3A schematically illustrates the propagation of two respective magnetic bubbles, shown in dashed lines, as each bubble travels responsive to the re-orientation of the rotary in-plane magnetic field as derived from the source 11. The first of these bubbles is shown as being located in the major propagation path included in the bubble input section 12, the bubble being propagated in the direction indicated by the arrows. The second bubble is located in the storage loop 21 and is shown in its path of travel completing one circuit of the closed loop included in the bubble storage section 14.

Figure 3B:
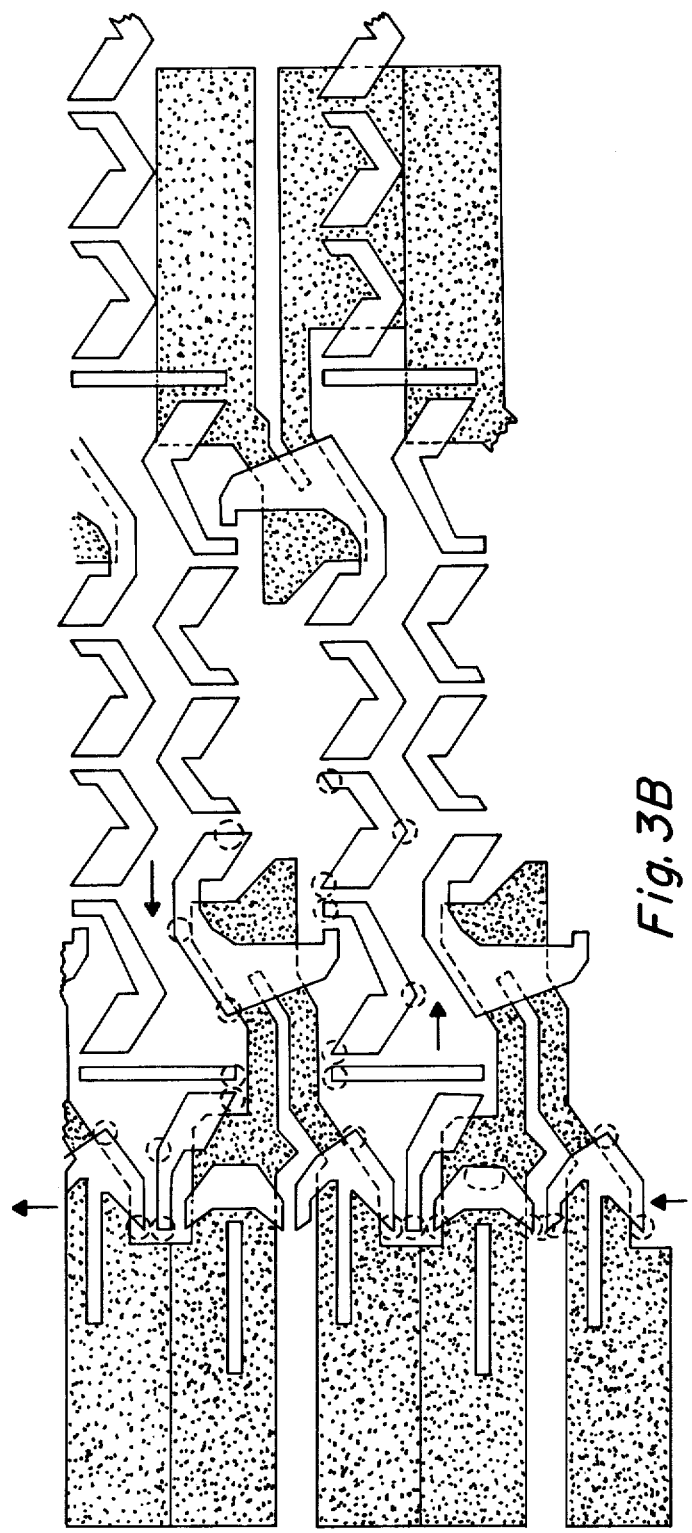
FIG. 3B is an enlarged, partially schematic, plan view similar to FIG. 2, showing the propagation movement of respective magnetic bubbles when the input swap transfer/replicate gate is actuated in a swap mode in being simultaneously transferred between a major propagation path of the bubble input section and a minor storage loop.
Figure 3C:
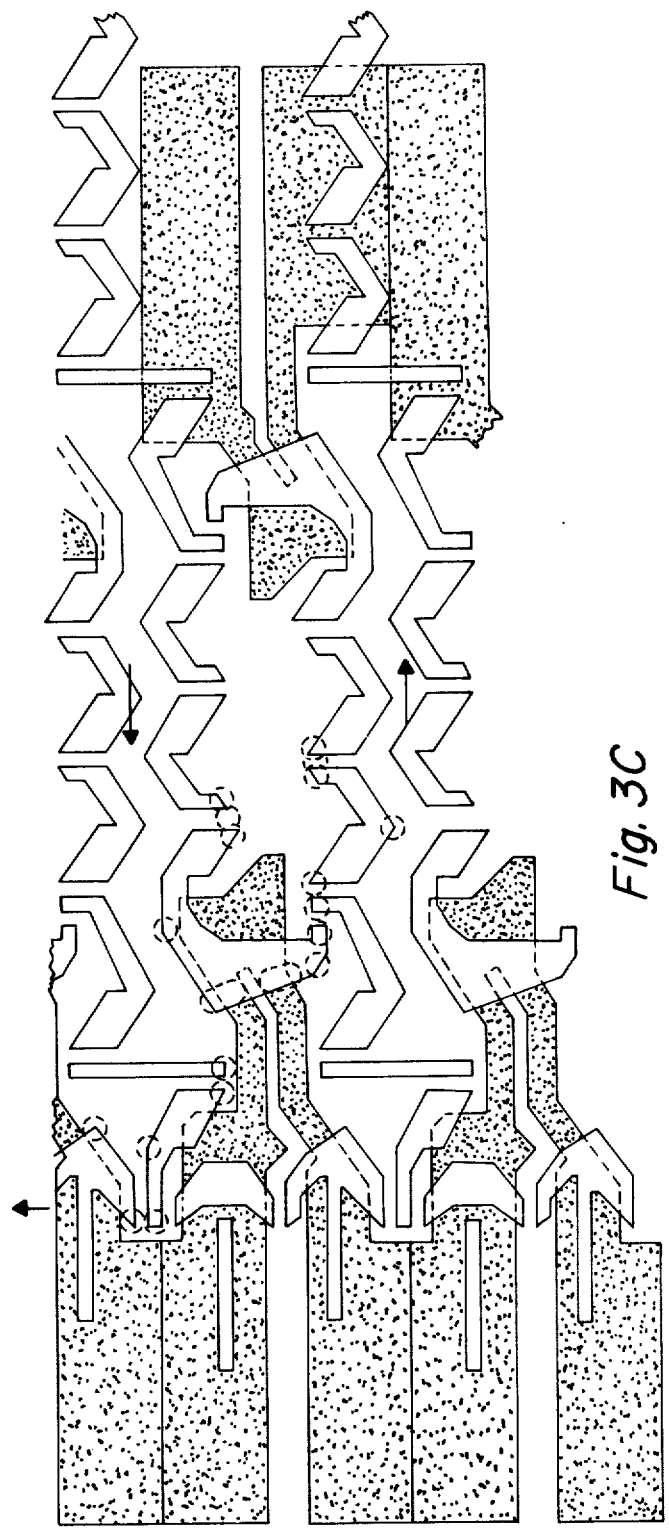
FIG. 3C is an enlarged, partially schematic, plan view similar to FIG. 2, showing the propagation movement of respective magnetic bubbles when the input swap transfer/replicate gate is actuated in a replicate mode to split the bubble in forming a second replicate bubble.
Figure 3D:
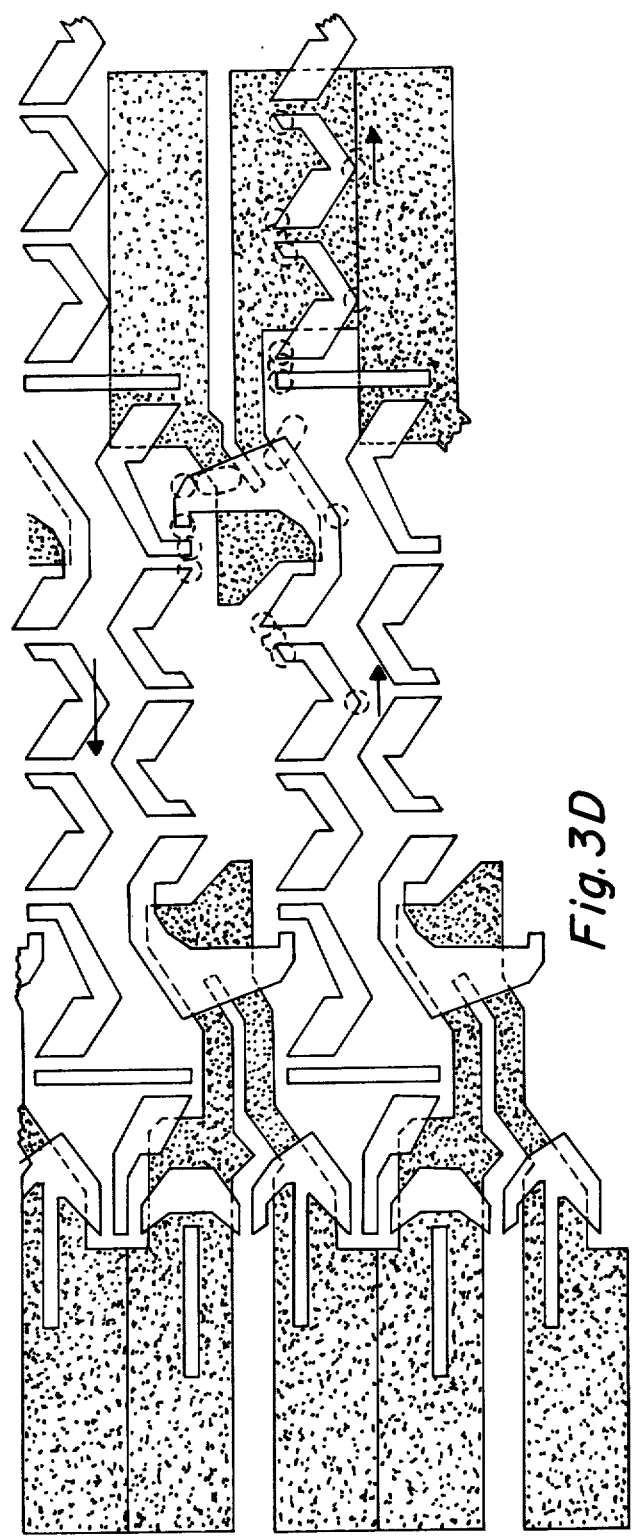
FIG. 3D is an enlarged, partially schematic, plan view similar to FIG. 2, showing the propagation movement of a magnetic bubble when the output replicate gate is actuated to provide a replicate function in splitting the bubble to form a second replicate bubble.

FIG. 3B is similar to FIG. 3A but schematically illustrates the propagation of two respective magnetic bubbles, shown in dashed lines, during a swap operation in which the input swap transfer/replicate gate 30 is activated by a pulse of energy of a predetermined extent delivered to the hairpin element 40 of the swap transfer/replicate gate 30. In this sense, it will be observed that a single magnetic bubble traveling along the major propagation path included in the bubble input section 12 in the direction of the arrows is diverted by the energy pulse so as to be retained on the transition propagation element 56 from where the bubble is picked off by the pick-off bar 57 disposed on the upstream side of the hairpin element 40. Thereafter, this bubble is directed along the bubble steering element 53 onto one course of the storage loop 21. Simultaneously, a bubble traveling along the other course of the storage loop 21 and directed toward the bight of the loop formed by the hook-like transfer element 50 is guided by the hook-like transfer element 50 out of the storage loop 21, and thereafter attracted by the other pick-off bar 57. The bubble is then subsequently directed along the bubble steering element 54 comprising the second spacer element on the downstream side of the hairpin element 40 onto the major propagation path included in the bubble input section 12. FIG. 3C illustrates the propagation of a single magnetic bubble, shown in dashed lines, as it travels through the swap transfer/replicate gate 30 when this gate is actuated in a replicate mode by imparting a signal pulse of a different magnitude to the hairpin element 40 than the pulse employed to actuate the gate in a swap mode. Thus, the gate 30 has the ability to serve alternately as an input swap gate or an output replicate gate. FIG. 3D is similar to FIG. 3C but schematically illustrates the propagation of a single magnetic bubble, shown in dashed lines, as it travels through the output replicate output gate 33 when this gate is activated. The bubble approaches the replicate gate 33 along the lower course of the closed storage loop 21, being stretched along the outer edges of the hook-like element 65. The bubble is then stretched across the portion of the hook-like element 65 which straddles the underlying hairpin loop region 62 of the hairpin element 58. At this point, the occurrence of a current pulse of the proper magnitude as received by the hairpin element 58 of the output replicate gate 33 splits the bubble, thereby forming a duplicate or replicate bubble. The now two bubbles repulse each other such that the lead bubble continues propagation in the closed minor loop 21 by being directed along the remaining portion of the hook-like transfer element 65, onto the end portion of the bubble steering element 66 and thence to the adjacent end portion of a bubble propagation element 47. The other bubble is attracted by the end of the pick-off bar 67 from where the bubble continues in its movement onto a bubble propagation element 47 included in the bubble output section 13.

Figure 4:
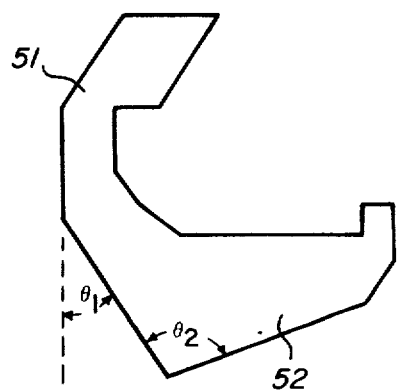
FIG. 4 is an enlarged plan view illustrating the asymmetric hook-like transfer/replicate element included in the input swap transfer/replicate gate structure and the output replicate gate structure in accordance with the present invention.

FIG. 4 is an enlarged illustration of the asymmetric hook-like transfer/replicate element included in the input swap transfer/replicate gate 30 as element 50 and the output replicate gate 33 as element 65. The angle $\theta_1$ associated with the asymmetric chevron-shaped portion 51 is preferably 35°±5°, whereas the angle $\theta_2$ marking the transition from the asymmetric chevron-shaped portion 51 to the wedge-shaped bight portion 52 is preferably 110°±5°. Further in this regard, referring to FIG. 2, the angle $\phi_1$ across the tapered head of the bubble propagation transition element 56 is preferably 90°±5°, and the angle $\phi_2$ associated with the head of the bubble propagation transition element 56 is preferably 40°±5°. The angles $\phi_3$ and $\phi_4$ of offset associated with the elongated legs 41,42 of the hairpin element 40, and the angle $\phi_5$ of offset associated with the legs 60,61 of the hairpin element 58 are each preferably 145°±5°. The respective swap transfer/replicate gates 30 and the output replicate gates 33 as so constructed offer improved operating performance in the processing of binary data as represented by magnetic bubbles and voids compared to the performance of the gate structures disclosed in the previously mentioned pending application, Ser. No. 783,996, filed Apr. 4, 1977, now U.S. Pat. No. 4,152,776.

Although the invention has been described with respect to specific preferred embodiments thereof, it will be understood that variations and modifications can be made within the scope of the invention by those skilled in the art. Therefore, it is intended that the appended claims be interpreted as broadly as reasonably permitted by the prior art to include all such variations and modifications within the scope of the present invention.

What is claimed is:

1. A magnetic bubble memory arrangement comprising:

a planar layer of magnetic material in which magnetic bubbles can be moved, first and second bubble propagation paths provided on a major surface of said planar magnetic layer for guiding the movement of said bubbles in said layer in response to a change in orientation of a rotary magnetic field within the plane of said layer, each of said first and second bubble propagation paths comprising a plurality of bubble propagation elements of magnetically soft material, said first bubble propagation path defining a closed loop, said second bubble propagation path being disposed substantially in orthogonal relation to said first bubble propagation path, and double level swap transfer/replicate gate means interposed between said first and second bubble propagation paths and including elements of magnetically soft material respectively correlated into each of said first and second bubble propagation paths, said swap transfer/replicate gate means being operable to interchange data as represented by chains of magnetic bubbles and voids between said first and second bubble propagation paths simultaneously in both directions and comprising a hairpin element of conductive material provided on the first level and being mounted on said planar layer of magnetic material, said hairpin element being substantially U-shaped and including a pair of elongated substantially parallel legs having respective intermediate parallel sections terminating in angularly offset end sections defining said hairpin loop, a terminal end portion integral with said angularly offset end sections of said elongated legs and having a beveled projection extending outwardly from said hairpin loop, and a pair of enlarged pads disposed at the opposite ends of said elongated legs, the second level of said swap transfer/replicate gate means being disposed at the same level as said first and second bubble propagation paths and including an asymmetric hook-like transfer/replicate element disposed at one end of said first bubble propagation path and forming a bight of the loop defined thereby, the opposite ends of said hook-like element being respectively disposed in the opposite courses of the loop defined by said first bubble propagation path, said hook-like element including a wedge-shaped bight disposed in overlapping relation to the hairpin loop of said hairpin element, said wedge-shaped bight portion tapering toward the leading end of said hook-like element so as to have a reduced width dimension at the leading end thereof, a first spacer element in the second level associated with said first bubble propagation path and being arranged on one side of said hairpin element and including an end portion interposed between a corresponding end of said hook-like element and an element of said first bubble propagation path, a pair of second spacer elements in the second level respectively disposed on the opposite sides of said hairpin element, one of said second spacer elements being in off-set relation to said first spacer element and including one end portion interposed between individual bubble propagation elements included in said second bubble propagation path and being disposed on the same side of said hairpin element with respect to said first spacer element, and a pair of pick-off bars disposed in the second level of said swap transfer/replicate gate means, said pair of pick-off bars being located on opposite sides of said hairpin element in spaced relation to said first and second spacer elements respectively.

2. A magnetic bubble memory arrangement as set forth in claim 1, further including a third bubble propagation path disposed at the opposite end of said first bubble propagation path from said second bubble propagation path, double level replicate gate means interposed between said first and third bubble propagation paths and including elements of magnetically soft material respectively correlated into each of said first and third bubble propagation paths, said replicate gate means being operable to split respective magnetic bubbles so as to form a replicate magnetic bubble in addition to the original magnetic bubble for transferring one of the two bubbles from said first bubble propagation path to said third bubble propagation path while retaining the other of the two bubbles in said first bubble propagation path and comprising a hairpin element of conductive material provided on the first level and being mounted on said planar layer of magnetic material, said hairpin element being substantially U-shaped and including a pair of angularly offset substantially parallel legs joined at one end to define a hairpin loop, a terminal end portion integral with said parallel legs and having a beveled projection extending outwardly from said hairpin loop, and a pair of enlarged pads disposed at the opposite ends of said parallel legs, the second level of said replicate gate means being disposed at the same level as said first, second, and third bubble propagation paths and including an asymmetric hook-like transfer/replicate element disposed at the opposite end of said first bubble propagation path and forming a bight of the loop defined thereby, the opposite ends of said hook-like element being respectively disposed in the opposite courses of the loop defined by said first bubble propagation path, said hook-like element including a wedge-shaped bight portion disposed in overlapping relation to the hairpin loop of said hairpin element included in said replicate gate means, said wedge-shaped bight portion tapering toward the leading end of said hook-like element so as to have a reduced width dimension at the leading end thereof, a third spacer element in the second level associated with said first bubble propagation path and being arranged on one side of said hairpin element included in said replicate gate means, said third spacer element having an end portion interposed between a corresponding end of said hook-like element and an element of said first bubble propagation path, and a second pair of pick-off bars disposed in the second level of said replicate gate means, said second pair of pick-off bars being located on opposite sides of the hairpin loop of said hairpin element included in said replicate gate means.

3. A magnetic bubble memory arrangement as set forth in claim 2, wherein the plurality of bubble propagation elements included in said first bubble propagation path are asymmetric chevron elements.

4. A magnetic bubble memory arrangement as set forth in claim 2, further including
pulse generator means operably associated with said hairpin elements of said swap transfer/replicate gate means and said replicate gate means for directing pulse energy thereto, and
control means regulating said pulse generator means to deliver pulse energy selectively to said hairpin elements of said swap transfer/replicate gate means and said replicate gate means for actuation thereof in a predetermined manner.

5. A magnetic bubble memory arrangement as set forth in claim 2, wherein said second bubble propagation path comprises a continuing sequence of alternating dissimilar bubble propagation elements.

6. A magnetic bubble memory arrangement as set forth in claim 5, wherein said continuing sequence of alternating dissimilar bubble propagation elements of said second bubble propagation path includes
an asymmetric pickax element having an elongated handle overlying one of the enlarged pads of said asymmetric hairpin element associated with said swap transfer/replicate gate means and having an integral asymmetric head defining a pair of tapering wing portions extending outwardly with respect to said handle and on opposite sides thereof, and
a symmetrical head member having oppositely disposed tapering wing portions extending outwardly therefrom, and a bar element spaced from said symmetrical head portion and extending orthogonally with respect thereto in substantially parallel relationship to the handle of said asymmetric pickax element.

7. In a magnetic bubble memory arrangement having a planar layer of magnetic material in which magnetic bubbles can be moved and a plurality of bubble propagation elements of magnetically soft material disposed on said planar magnetic layer and defining a bubble propagation path in the form of a loop, a transfer/replicate bubble propagation path component of magnetically soft material disposed on said planar magnetic layer, said component comprising:
an asymmetric hook-like transfer/replicate element forming a bight at one end of the loop,
the opposite ends of said hook-like element being respectively disposed in the opposite courses of the loop,
said hook-like element including a wedge-shaped bight portion disposed between the opposite courses of the loop and tapering toward the leading end of said hook-like element so as to have a reduced width dimension at the leading end thereof, and an asymmetric chevron-shaped portion integral with said wedge-shaped bight portion and forming an extension of one course of the loop, and
the leading end of said hook-like element being disposed outwardly with respect to the end of said asymmetric chevron-shaped portion in relation to the loop at the end of the other course of the loop.

8. In a magnetic bubble memory arrangement as set forth in claim 7, wherein the transition angle between the asymmetric chevron-shaped portion and the wedge-shaped bight portion of said hook-like element is $110° \pm 5°$.

9. A magnetic bubble memory arrangement comprising:
a planar layer of magnetic material in which magnetic bubbles can be moved,
a bubble propagation path provided on a major surface of said planar magnetic layer for guiding the movement of said bubbles in said layer in response to a change in orientation of a rotary magnetic field within the plane of said layer, said bubble propagation path comprising a plurality of bubble propagation elements of magnetically soft material defining a closed loop,
another bubble propagation path disposed at one end of the loop defined by said first-mentioned bubble propagation path,
double level replicate gate means interposed between said bubble propagation paths and including elements of magnetically soft material respectively correlated into each of said bubble propagation paths, said replicate gate means comprising:
a hairpin element of conductive material provided on the first level and being mounted on said planar layer of magnetic material, said hairpin element being substantially U-shaped and including a pair of angularly offset substantially parallel legs joined at one end to define a hairpin loop, a terminal end portion integral with said parallel legs and having a beveled projection extending outwardly from said hairpin loop, and a pair of enlarged pads disposed at the opposite ends of said parallel legs,
the second level of said replicate gate means being disposed at the same level as said bubble propagation paths and including an asymmetric hook-like transfer/replicate element disposed at said one end of said first-mentioned bubble propagation path and forming a bight of the loop defined thereby, the opposite ends of said hook-like element being respectively disposed in the opposite courses of the loop defined by said first-mentioned bubble propagation path, said hook-like element including a wedge-shaped bight portion disposed in overlapping relation to the hairpin loop of said hairpin element, said wedge-shaped bight portion tapering toward the leading end of said hook-like transfer element so as to have a reduced width dimension at the leading end thereof, a spacer element in the second level associated with said first-mentioned bubble propagation path and being arranged on one side of said hairpin element and including an end portion interposed between a corresponding end of said hook-like element and an element of said first-mentioned bubble propagation path, and a pair of pick-off bars disposed in the second level of said replicate gate means, said pair of pick-off bars being located on opposite sides of the hairpin loop of said hairpin element.

* * * * *